US008406344B2

(12) United States Patent
Eitel

(10) Patent No.: US 8,406,344 B2
(45) Date of Patent: Mar. 26, 2013

(54) COMPENSATOR UNIT AND COMPENSATION METHOD FOR I/Q IMBALANCE ERRORS

(75) Inventor: Ben Eitel, Gärtringen (DE)

(73) Assignee: Sony Corporation, Tokyo (JP)

( * ) Notice: Subject to any disclaimer, the term of this patent is extended or adjusted under 35 U.S.C. 154(b) by 421 days.

(21) Appl. No.: 12/748,844

(22) Filed: Mar. 29, 2010

(65) Prior Publication Data

US 2010/0266067 A1 Oct. 21, 2010

(30) Foreign Application Priority Data

Mar. 31, 2009 (EP) ..................................... 09004728

(51) Int. Cl.
*H04L 27/00* (2006.01)
(52) U.S. Cl. ........................................................ 375/324
(58) Field of Classification Search .................. 375/324, 375/229, 230, 232, 235
See application file for complete search history.

(56) References Cited

U.S. PATENT DOCUMENTS

| 5,705,949 | A | 1/1998 | Alelyunas et al. | |
|---|---|---|---|---|
| 6,892,060 | B2 | 5/2005 | Zheng | |
| 6,940,916 | B1 | 9/2005 | Warner et al. | |
| 7,349,677 | B2 | 3/2008 | Jensen | |
| 2005/0260949 | A1 | 11/2005 | Kiss et al. | |
| 2007/0080835 | A1 | 4/2007 | Maeda et al. | |
| 2007/0291883 | A1 | 12/2007 | Welz et al. | |
| 2008/0089443 | A1* | 4/2008 | Sanada et al. | 375/319 |
| 2009/0122918 | A1* | 5/2009 | Li et al. | 375/317 |
| 2012/0039375 | A1* | 2/2012 | Eitel | 375/224 |
| 2012/0106686 | A1* | 5/2012 | Zhang et al. | 375/349 |
| 2012/0170629 | A1* | 7/2012 | Park et al. | 375/224 |
| 2012/0178392 | A1* | 7/2012 | Hormis | 455/205 |
| 2012/0263215 | A1* | 10/2012 | Peng | 375/221 |

FOREIGN PATENT DOCUMENTS

| GB | 2 433 684 A | 6/2007 |
|---|---|---|
| WO | WO 2006/064435 A1 | 6/2006 |
| WO | WO 2007/093790 A1 | 8/2007 |

OTHER PUBLICATIONS

Lauri Anttila, et al., "Circularity-Based I/Q Imbalance Compensation in Wideband Direct-Conversion Receivers", IEEE Transactions on Vehicular Technology, vol. 57, No. 4, Jul. 2008, pp. 2099-2113.
Lauri Anttila, et al., "Frequency-Selective I/Q Mismatch Calibration of Wideband Direct-Conversion Transmitters", IEEE Transactions on Circuits and Systems-II: Express Briefs, vol. 55, No. 4, Apr. 2008, pp. 359-363.

(Continued)

*Primary Examiner* — Jaison Joseph
(74) *Attorney, Agent, or Firm* — Oblon, Spivak, McClelland, Maier & Neustadt, L.L.P.

(57) ABSTRACT

A compensator unit compensates frequency-dependent imbalance between a sampled in-phase and a sampled quadrature phase signal. The compensator unit includes a delay channel (381) and a filter channel (382). The delay channel (381) delays an intermediate signal x(t), which is obtained by superposition of the sampled in-phase and quadrature phase signals, by an integer multiple greater than zero. The filter channel (382) includes a filter (320) with a complex conjugated block (321) and with variable filter coefficients determined on base of autocorrelation function values of the intermediate signal x(t). The filter coefficients are determined such that the complementary autocorrelation of a compensator output signal y(t) is minimized for the filter span.

14 Claims, 5 Drawing Sheets

OTHER PUBLICATIONS

M. Mailand, et al., "IQ-imbalance and its compensation for non-ideal analog receivers comprising frequency-selective components", Advances in Radio Science, vol. 4, 2006, pp. 189-195.

Piotr Rykaczewski, et al., "Blind I/Q Imbalance Compensation in Multipath Environments", http://ieeexplore.ieee.org/Xplore/login.jsp?url=stamp/stamp.jsp?arnumber=04252563, May 27-30, 2007, pp. 29-32.

Mikko Valkama, et al., "Digital Filter Design for I/Q Imbalance Compensation", http://cat.inist.fr/?aModele=afficheN&cpsidt=14175105%20%20%20, Sep. 4-8, 2000, 4 Pages.

Marko Mailand, et al., "Blind IQ-Imbalance Compensation Using Iterative Inversion for Arbitrary Direct Conversion Receivers", http://www.eurasip.org/Proceedings/Ext/IST05/papers/140.pdf, 2005, 5 pages.

* cited by examiner

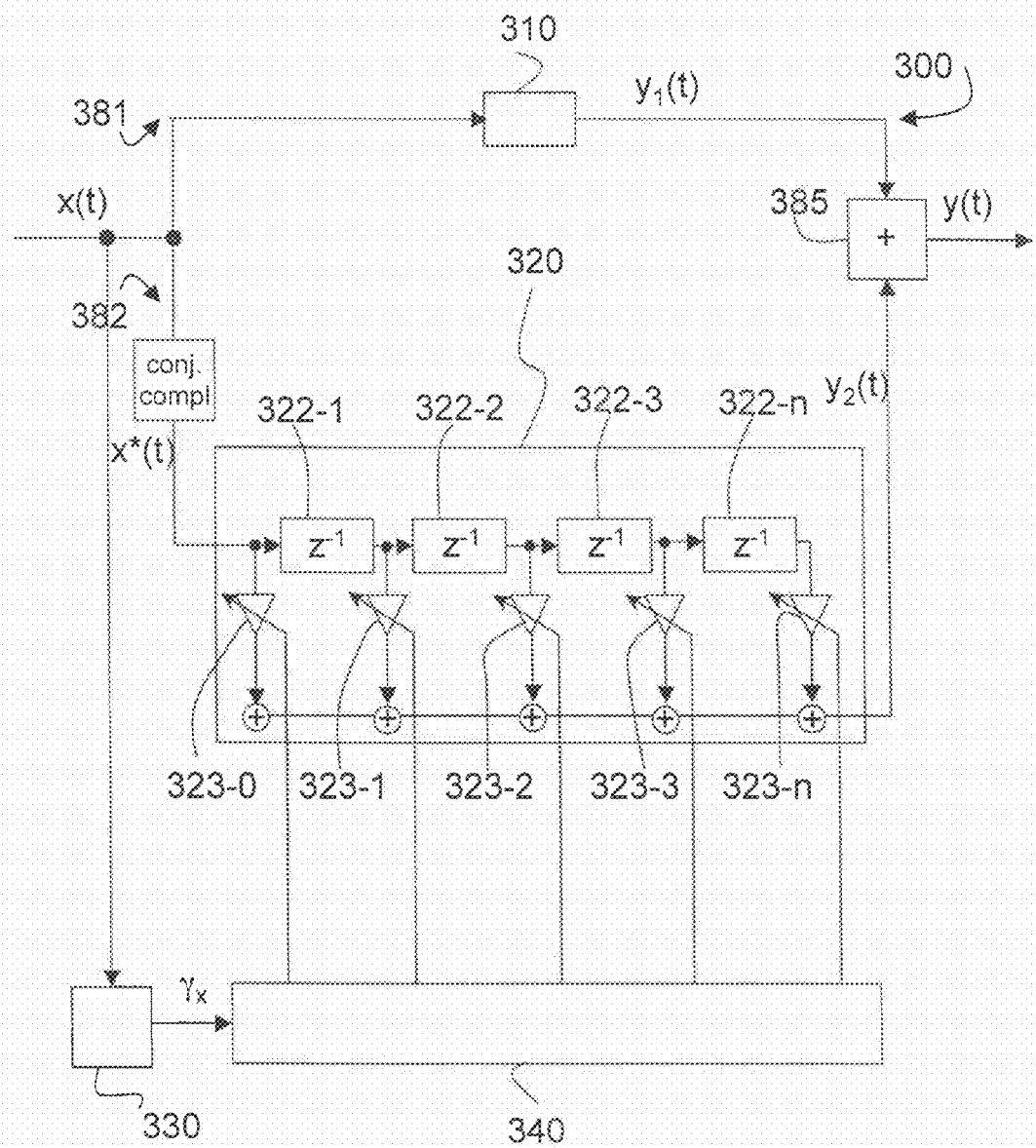

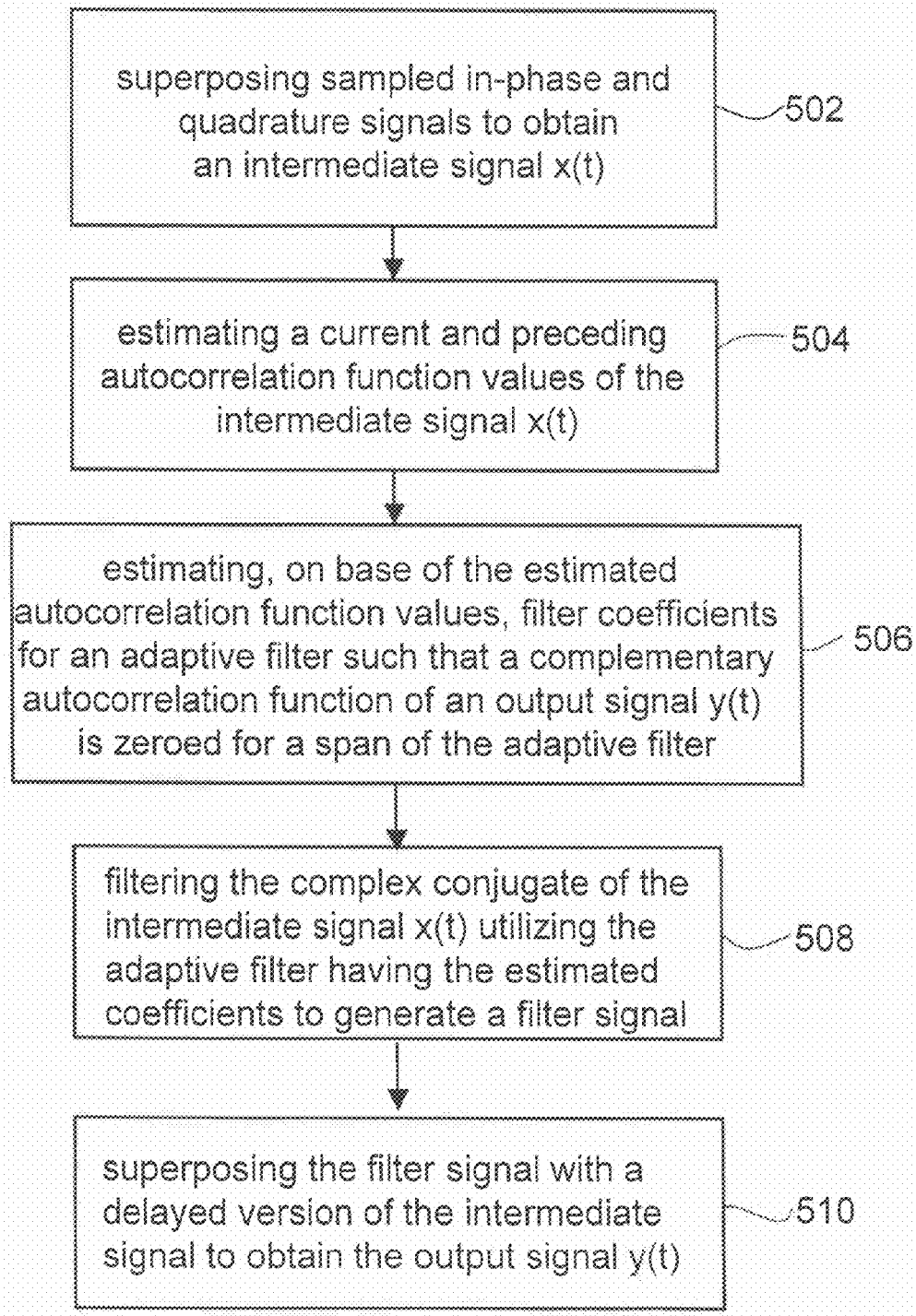

COMPENSATOR UNIT AND COMPENSATION METHOD FOR I/Q IMBALANCE ERRORS

An embodiment of the present invention relates to a method for processing modulated carrier signals and is directed to the compensation of an I/Q imbalance between an in-phase and a quadrature channel in a quadrature demodulator. Further embodiments relate to compensation and receiver units configured to utilize said signal processing method including said compensation method for I/Q imbalance.

BACKGROUND

Quadrature modulation systems modulate a first source signal onto an in-phase component (I) and a second source signal onto a quadrature component (Q) of a carrier signal, wherein the quadrature component is 90 degrees out of phase with the in-phase component. Both components are superposed and sent through a real channel. The reverse process is performed in the receiver. The received signal is down-converted to recover the first and second source signals. The first and the second source signals may be independent analog signals or may derived from a sole digital signal that has been split up into a first and a second digital source signal on the transmission side and that may be recovered from merging the received first and second source signals on the receiver side.

Receiver architectures that utilize I/Q signal processing are vulnerable to mismatches (imbalance) between the I and the Q paths (channels). For example, a splitter unit configured to divide the incoming received signal equally between the I and Q paths may introduce phase and gain differences. Different signal delays in the two paths may cause an additional phase imbalance. A phase shifter which, from a local oscillator output, generates a quadrature phase signal may provide a differential phase which is not exactly 90 degrees. The I and Q channel mixers might have different conversion modes which may be frequency dependent. In addition, filters and amplifiers in the I and Q paths are typically not perfectly matched. These I/Q mismatches have detrimental effects on the receiver performance.

The present invention provides a compensation technique that delivers satisfying results even if the I/Q mismatch contains a frequency-dependent portion resulting from the application of non-causal signal condition functions, for example filters, in the in-phase and quadrature paths.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

FIG. 3 is a schematic block diagram of a compensator unit in accordance with a further embodiment of the invention.

FIG. 5 is a simplified flow chart illustrating a method of compensating imbalance between the I/Q channels in a quadrature demodulator in accordance with another embodiment of the invention.

DETAILED DESCRIPTION

Figure 1:
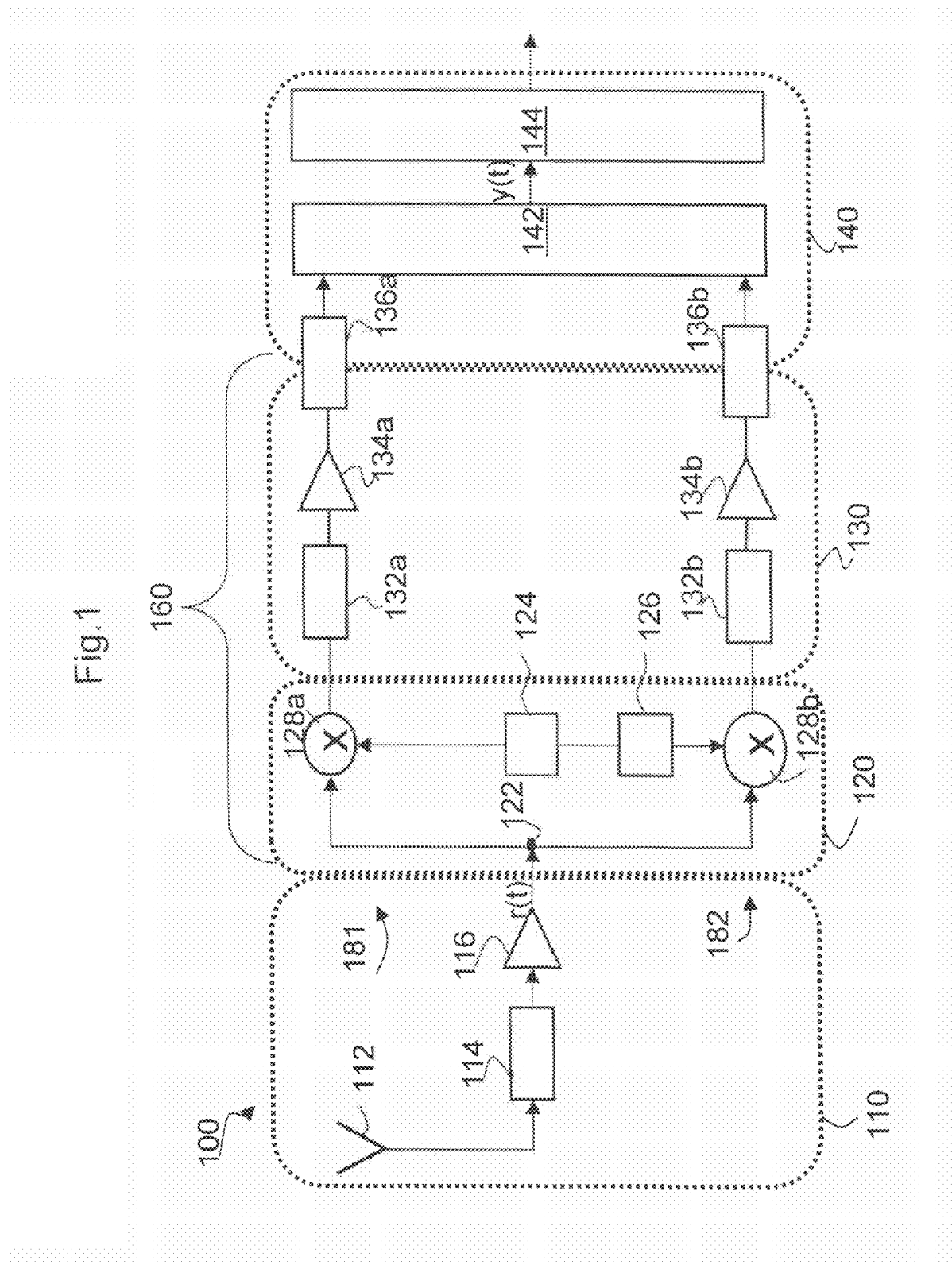
FIG. 1 is a schematic block diagram of a receiver unit including a compensation unit in accordance with an embodiment of the invention.

FIG. 1 illustrates a receiver unit 100 including a receiver stage 110, a mixer stage 120, an analogue processing stage 130 and a digital processing stage 140, wherein the mixer stage 120 and the analogue processing stage 130 form a quadrature modulator 160. Each of the stages 110-140 may be realized as an assembly of discrete devices, as an assembly including both discrete devices and integrated circuits, or as a sole integrated circuit. For example, the digital processing stage 140 may be a digital signal processor (DSP) that includes or does not include analogue/digital converters (ADCs). According to another embodiment at least parts of the analogue stage 130 and the digital processing stage 140 are integrated in the same mixed-signal processor.

The receiver system 100 may be part of a receiver for a positioning system, a cellular phone, a radio tuner, or a video tuner, by way of example.

The receiver stage 110 may include an antenna element 112 that is capable of receiving radio frequency (RF) signals and transforming them into a conduction-bound receiver signal. In accordance with other embodiments, the receiver stage 110 includes a splitter element in lieu of the antenna element 112 wherein the splitter element monitors the communication on a transmission line and branches off a selected receiver signal. A receiver filter 114 configured to narrow the receiver signal bandwidth and a receiver amplifier 116 configured to condition the incoming receiver signal may be provided in the signal path of the receiver stage 110. The conditioned receiver signal r(f) contains one modulated carrier signal or an arbitrary collection of modulated carrier signals. The carriers may have any technical relevant frequency in the range from DC up to several GHz, for example in the range from 1 MHz to 1 GHz. In accordance with an embodiment, a carrier frequency is between 60 MHz and 70 MHz.

The conditioned receiver signal r(t) is forwarded to the mixer stage 120 that includes a splitter unit 122 distributing the conditioned receiver signal r(t) on an in-phase channel 181 and on a quadrature channel 182. The mixer stage 120 may further include a local oscillator 124 configured to generate a local oscillator signal $\cos(\omega_{Lo}t)$ having the angular frequency $\omega_{Lo}$, a phase shifter unit 126 which is capable of shifting the phase of the local oscillator signal by 90 degrees, a first mixer 128a in the in-phase channel 181, and a second mixer 128b in the quadrature channel 182. The first mixer 128a down-converts the conditioned receiver signal r(t) to an in-phase signal. The in-phase signal may have an intermediate frequency (IF) corresponding to the differential frequency of the local oscillator frequency $f_{LO}$ and the carrier frequency $f_O$ or may be a base-band representation of a corresponding first source signal. The second mixer 128b down-converts the conditioned receiver signal to a quadrature phase signal, which may have the intermediate frequency (IF) or which may be a base-band representation of a corresponding second source signal. The quadrature phase signal is in quadrature to the in-phase signal. Typically, the first and second mixers 128a, 128b have the same electric characteristics and deviate in their electric characteristics only due to fabrication tolerances. The in-phase signal and the quadrature phase signal are forwarded to the analogue processing stage 130.

In the in-phase channel 181, the analogue processing stage 130 may include a first filter 132a, which may be a band-pass filter or, in case of zero-IF or low-IF applications, a low-pass filter. In the quadrature channel 182, the analogue processing stage 130 may include a second filter 132b, for example a low-pass filter or a band-pass filter. The first and second filters 132a, 132b may block further mixer frequencies generated in the mixer stage 120. First and second amplifiers 134a, 134b may be arranged in the in-phase and the quadrature channels so as to condition the respective channel signal for a following A/D conversion. The first and second filters 132a, 132b ideally have the same electric characteristics and deviate in their electric characteristics only due to fabrication tolerances. The same applies to the first and second amplifiers 134a, 134b.

A first ADC 136a samples the filtered and conditioned in-phase signal and a second ADC 136b samples the filtered and conditioned quadrature phase signal in predefined regular sample intervals defined by a common sample rate of the ADCs 136a, 136b. The sampled in-phase and quadrature phase signals are further processed in the digital processing stage 140.

The digital processing stage 140 includes a compensator unit 142 for compensating frequency-dependent imbalance between the sampled in-phase and quadrature phase signals. In the compensator unit 140 the sampled in-phase and quadrature phase signals are superposed to obtain an intermediate signal x(t). Following a complex model as explained in detail with regard to FIG. 2, the sampled in-phase and quadrature phase signals are superposed by multiplying one of these, for example the quadrature phase signal, with the complex number j and adding the result to the other one of the in-phase and quadrature phase signals.

The compensator unit 142 contains a delay channel, which is configured to delay the intermediate signal x(t), and a filter channel including a filter with variable filter coefficients. The filter coefficients are determined on base of autocorrelation function values of the intermediate signal x(t) in a manner such that the complementary autocorrelation of an output signal y(t) of the compensator unit 140 is minimized for a plurality of sample points, for example for the total filter span. In accordance with an embodiment, the complementary autocorrelation of the output signal y(t) may be zeroed or nearly zeroed. The compensator unit 142 further contains a superposition unit which is configured to superpose output signals of the delay and the filter channels to generate the output signal y(t).

If the delay channel delays the intermediate signal x(t) by at least one sample interval, the compensator unit 142 is capable of compensating frequency-dependent imbalance between the sampled in-phase and quadrature phase signals even if the imbalance becomes manifest in a non-causal difference function which is very likely to occur in practice.

The compensated output signal y(t) may be forwarded to a further digital processing unit 144, which, for example, may recover a digital data signal and/or which may perform further processing of the digital data signal.

Figure 2:
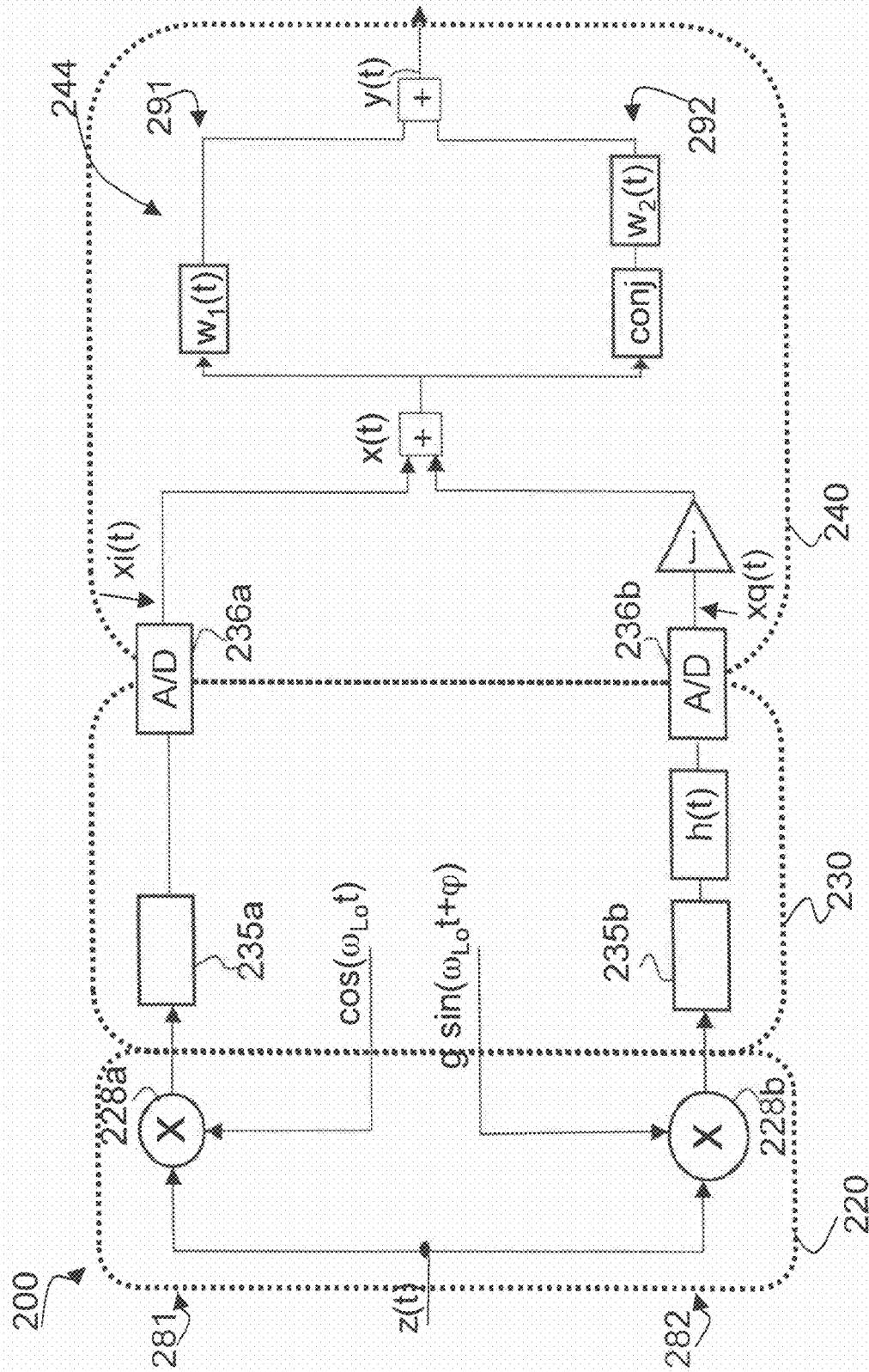
FIG. 2 is a schematic block diagram of a model modeling a quadrature demodulator having I/Q mismatches and a compensator unit in accordance with another embodiment of the invention.

FIG. 2 illustrates an I/Q imbalance model 200 including a mixer model 220, an analogue processing model 230, and a compensator model 240. The mixer model 220 includes a first mixer 228a in an in-phase channel (I channel) 281 and a second mixer 228b in a quadrature channel (Q channel) 282. According to this model, the complete I/Q imbalance is assigned to the quadrature channel 282. For that purpose, the local oscillator of the mixer model 220 is modeled with a signal of the form $\cos(\omega_{Lo}t)$ and the phase shifter is modeled with a signal of the form $-g\sin(\omega_{Lo}t+\phi)$, wherein the gain factor g represents the amplitude imbalance, wherein $g=(1+\epsilon)$ with $\epsilon$ being the relative amplitude imbalance, and the phase offset $\phi$ represents the phase imbalance between the in-phase and quadrature phase signals.

The analogue processing stage 230 is modeled as including a first signal conditioner 235a in the in-phase channel 281 and a second signal conditioner 235b in the quadrature channel 282, wherein the first and second signal conditioners 235a, 235b may include filters and amplifiers, by way of example. Then, a further component of the I/Q imbalance can be considered as a frequency response difference $H_\Delta(f)$ resulting from different frequency responses of the real signal conditioners and/or the real ADCs 236a, 236b. The frequency response difference $H_\Delta(f)$ is alternatively described by the corresponding impulse response $h_\Delta(t)$ which may also be solely assigned to the quadrature channel 282 without loss of generality. With these assumptions, the mixers 228a, 228b and the signal conditioners 235a, 235b in both channels 281, 282 may be considered as ideally identical respectively.

In the following, a complex signal z(t) is defined such that the conditioned receiver signal r(t) at the input of the mixer stage 220 represents the real part of z(t). The signal z(t) is a signal with perfect I/Q balance:

$$r(t)=2Re\{z(t)e^{j\omega_0 t}\} \tag{1}$$

With $\delta(t)$ denoting the impulse function, an intermediate signal x(t) that can be observed as a sum signal of the sampled output signals $x_i(t)$, $x_q(t)$ of the I and Q channels 281, 282 is given by $$x(t) = \frac{1}{2}(\delta(t) + ge^{-j\phi}h_\Delta(t)) * z(t) + \frac{1}{2}(\delta(t) - ge^{j\phi}h_\Delta(t)) * z^*(t) \tag{2}$$

With $$g_1(t) = \frac{1}{2}(\delta(t) + ge^{-j\phi}h_\Delta(t)) \text{ and } g_2(t) = \frac{1}{2}(\delta(t) - ge^{j\phi}h_\Delta(t))$$

the observed intermediate signal x(t) can be written in the form $$x(t)=g_1(t)*z(t)+g_2(t)*z^*(t) \tag{2a}$$

The spectrum X(f) of the observed signal x(t) is $$X(f)=G_1(f)Z(f)+G_2(f)Z^*(-f) \tag{2b}$$

In the time domain, the observed signal includes a complex conjugated portion which corresponds to a complex conjugated and mirrored portion in the frequency domain. In the frequency domain, the spectrum X(f) of the observed signal x(t) contains the spectrum Z(f) of the ideal signal z(t) and an attenuated mirror spectrum $Z^*(-f)$ of the ideal signal z(t). In the time domain, the observed signal contains the ideal signal z(t) and the image signal, which is the complex conjugated signal $z^*(t)$.

Equation (2b) illustrates that the I/Q imbalance causes mirror-frequency interference which stems from the conjugate signal term present in the observed intermediate signal x(t). In the following, a structure of the compensator model 244 is defined that contains a first branch 291 and a second branch 292. The first branch 291 transmits the originally observed intermediate signal x(t) obtained by superposition of the sampled in-phase and quadrature phase signals $x_i(t)$ and $x_q(t)$ and is characterized by a first compensator impulse response $w_1(t)$. The second branch 292 transmits the complex conjugated observed intermediate signal $x^*(t)$ and is characterized by a second compensator impulse response $w_2(t)$. The superposition of the output signals of both branches 291, 292 results in the compensator output signal y(t), which is given by $$y(t)=w_1(t)*x(t)+w_2(t)*x^*(t) \tag{3}$$

The compensator output signal y(t) shall represent an estimation for the ideal signal z(t). Then, in equation (3), x(t) can be substituted by the definition in (2a).

$$y(t)=(w_1(t)*g_1(t)+w_2(t)*g_2*(t))*z(t)+(w_1(t)*g_2(t)+w_2(t)*g_1*(t))*z*(t) \quad (4)$$

Eliminating the complex conjugated portion, which is the source for the mirror-frequency interference, sets forth the condition $$w_1(t)*g_2(t)+w_2(t)*g_1*(t)=0 \quad (5)$$

If the time responses $w_1(t)$ and $w_2(t)$ fulfill equation (5), the complex conjugated portion is removed. $W_1(t)$ and $w_2(t)$ represent impulse responses of filters whose coefficients are determined in the following.

For determining the unknown filter coefficients for $w_1(t)$ and $w_2(t)$, the complex received signal z(t) is considered as a complex random signal and the statistical properties of the perfectly balanced signal z(t) are evaluated. The complex received signal z(t) can be considered as having a time invariant mean value, i.e. z(t) is wide-sense stationary, and as having a time invariant complementary autocorrelation function. In addition, the mean value of z(t) can be set equal to zero by removing an eventual DC bias in z(t), such that z(t) can be considered circular. Under these assumptions, the complementary autocorrelation function $c_z(\tau)$ is equal zero for all values of $\tau$. In the case of ideal compensation, the same applies to the compensator output signal y(t) which represents an estimation for z(t):

$$c_y(\tau)=E\{y(t)y(t-\tau)\}=0 \quad (6)$$

From substituting, in equation (6), y(t) as defined in equation (4) follows $$0=E\{(w_1(t)*x(t)+w_2(t)*x*(t))(w_1(t-\tau)*x(t-\tau)+w_2(t-\tau)*x*(t-\tau))\} \quad (7)$$

With the autocorrelation function $\gamma_x(\tau)$ and the complementary autocorrelation function $c_x(\tau)$ of x(t) defined as $c_x(\tau)=E\{x(t)x(t-\tau)\}$ and $\gamma_x(\tau)=E\{x(t)x*(t-\tau)\}$ equation (7) can be rewritten as equation (7a):

$$0=w_1(\tau)*w_1(-\tau)*c_x(\tau)+w_1(\tau)*w_2(-\tau)*\gamma_x(\tau)+w_1(-\tau)*w_2(\tau)*\gamma_x(-\tau)+w_2(\tau)*w_2(-\tau)*c_x*(\tau) \quad (7a)$$

Equation (7a) is not directly solvable. An approximation $w_2(\tau)*w_2(-\tau)*c_x*(\tau)\approx 0$ can be made. This leads to equation $$0=w_1(\tau)*w_1(-\tau)*c_x(\tau)+w_1(\tau)*w_2(-\tau)*\gamma_x(\tau)+w_1(-\tau)*w_2(\tau)*\gamma_x(-\tau) \quad (7b)$$

It could be shown by the inventor that, if $w_1(t)$ describes a delay function delaying the input signal by an integer multiple of the sample interval, the compensator unit 242 facilitates the compensation of mismatches of non-causal frequency difference functions $H_A(f)$ in the mixer and the analogue processing stage. In addition, the restriction of $w_1(t)$ to a simple delay function leaves the filter coefficients for $w_2(t)$ being calculable from equation (7b). Incorporating for $w_1(t)$ the condition $$w_1(t)=\delta(t-L\cdot T_s), L=0,1,\ldots,N-1 \quad (8)$$

with $T_s$ representing the sample duration and $f_s=1/T_s$ representing the sampling frequency, equation (7b) can be solved for $w_2(t)$ in order to get filter coefficients for an adaptive digital filter representing the second branch 292 of the compensator model 240.

For example, a practical blind estimation algorithm can be obtained utilizing instantaneous sample statistics of the received signal. The compensator model may be described as $$y(t)=x(t)*\delta(t-L\cdot T_s)+x*(t)*w_2(t) \quad (9)$$

In matrix notation, the second term $x*(t)*w_2(t)$ can be written as $\vec{w_2}^T\vec{x}*(t)$ where $\vec{w_2}^T=[w_{1,2}, w_{2,2}, \ldots, w_{N,2}]^T$ denotes the N filter coefficients of the filter in the second branch 292 of the compensator model 240 at time index t, and $\vec{x}*(t)=[x*(t), x*(t-1), \ldots, x*(t-N+1)]^T$ denotes the values of the conjugate complex signal of x(t) at the current and previous sample times.

The N filter coefficients of the compensator model may be updated such that the complementary autocorrelation of the compensator output signal equals to zero for the filter span N.

In accordance with another embodiment, equation (7b) is solved for $w_2(\tau)$ using a matrix notation. With N being the length of the compensation filter, $\vec{c_x}=[c_x(0), c_x(1), \ldots, c_x(N-1)]^T$, $\vec{w_2}=[w_2(0), w_2(1), \ldots, w_2(N-1)]^T$ and neglecting a term which links a matrix including the complementary autocorrelation function of the intermediate signal x(t) with the filter coefficients, the filter coefficients can be calculated on basis of the following equation:

$$\vec{w_2}=(A_x+B_x)\vec{c_x} \quad (10)$$

Equation (10) has a solution for the matrices $A_x$ and $B_x$ which is represented by equations (11) and (12):

$$A_x = \begin{bmatrix} \gamma_x(-L) & \gamma_x(1-L) & \cdots & \gamma_x(N-L-1) \\ \gamma_x(-1-L) & \gamma_x(-L) & \cdots & \gamma_x(N-L-2) \\ \vdots & \vdots & \ddots & \vdots \\ \gamma_x(-N-L+1) & \gamma_x(-N-L+2) & \cdots & \gamma_x(-L) \end{bmatrix} \quad (11)$$

$$B_x = \begin{bmatrix} \gamma_x(-L) & \gamma_x(1-L) & \cdots & \gamma_x(N-L-1) \\ \gamma_x(1-L) & \gamma_x(2-L) & \cdots & \gamma_x(N-L) \\ \vdots & \vdots & \ddots & \vdots \\ \gamma_x(N-L-1) & \gamma_x(N-L) & \cdots & \gamma_x(2N-L-2) \end{bmatrix} \quad (12)$$

FIG. 3 illustrates details of a compensator unit 300. An intermediate signal x(t) obtained by superposition of the sampled in-phase and quadrature phase signals is forwarded to a delay channel 381 and to a filter channel 382 provided in parallel to the delay channel 381. The delay channel 381 is configured to delay the intermediate signal x(t) and generates a delayed version $y_1(t)$ of the intermediate signal on its output. The filter channel 382 includes a complex conjugated block 321 configured to provide the complex conjugated signal x*(t) and a filter 320 with variable filter coefficients determined on base of autocorrelation function values of the intermediate signal x(t) such that the complementary autocorrelation of a compensator output signal y(t) is zeroed for several sample time points, for example a span of the filter 320. The filter channel 382 generates a filtered signal $y_2(t)$ on its output. A superposition unit 385 is configured to superpose the echo and filter signals $y_1(t)$, $y_2(t)$ to generate the compensator output signal y(t).

The delay channel 381 comprises a delay unit 310 configured to delay the intermediate signal x(t) by an integer multiple L in terms of a sampling interval, wherein the sampling interval is given by the sample rate of the sampled in-phase and quadrature phase signals. If the integer multiple L is greater than zero, the compensator unit 300 is capable of compensating imbalances caused by non-causal difference functions in I/Q channels preceding the compensator unit 300. In accordance with an embodiment, the delay channel 381 consists of the delay unit 310.

In accordance with an embodiment, the filter 320 comprises a number N of stages arranged in series, wherein each stage may include one delay unit 322-1, 322-2, . . . , and one weighting unit 323-0, 323-1, each of them described by its filter coefficient $w_2(n)$. The outputs of the stages are superposed or summed up to generate the filtered signal $y_2(t)$. If the filter 320 has one or more main taps, these are shifted by 1 at each point in time. The filter 320 may have at least 1 and up to 1000 stages, for example between 1 and 10 stages. The values for N and L depend on sample rate, type and strength of fading and specification requirements. According to an embodiment referring to frequency flat I/Q imbalance, N may be 1 and L may be set equal zero. In accordance with embodiments referring to frequency selective fading, both N and L may typically set greater zero, for example in the range between 1 and 20. According to other embodiments, L is less than N, for example L is N decreased by one. In accordance with other embodiments, N is in the range between 3 and 10 and L is set to N−1.

The compensator unit 300 further comprises an estimator unit 330 and a filter coefficient calculator 340. The estimator unit 330 is adapted for estimating the autocorrelation function values $\gamma_x$ from the intermediate signal x(t) by using block (or recursive) estimation. The filter coefficient calculator 340 is capable of determining, from the autocorrelation function values $\gamma_x$ of the intermediate signal x(t) and the compensator output signal, the respective filter coefficients $w_2(1)$, $w_2(2)$, ..., $w_2(n)$. The filter coefficients are selected such that the complementary autocorrelation values of the compensator output signal y(t) are zeroed, for example for the total filter span. According to an embodiment, the filter coefficients $w_2(1), w_2(2), \ldots, w_2(n)$ are calculated by solving the equation (10) using the matrices in equations (11) and (12). The filter coefficient calculator 340 may also be configured for a post-processing of the filter coefficients, e.g. ensemble averaging over independently estimated filter coefficient sets.

Each single component, some components or all components of the compensator unit 300 may be realized by a program or as electronic circuits, for example as electronic circuits integrated in one or more integrated circuits, for example in a DSP or in an application specific integrated circuit (ASIC).

Figure 4A:
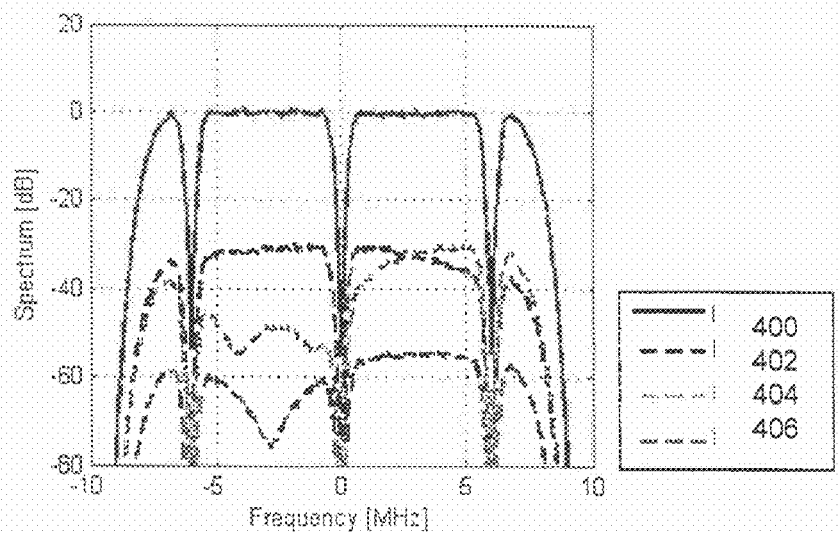
FIG. 4A is a diagram showing spectra of original and image signals for illustrating the effect of a compensator unit according to an embodiment of the invention.

FIG. 4A illustrates the effect of a compensation method according to an embodiment of the invention. Spectrum 400 is the spectrum of a desired output signal of a quadrature demodulator. Spectrum 402 is the image portion of a non-compensated output signal of a non-ideal I/Q demodulator which is characterized by a frequency difference function $H_A(f)$ having non-causal properties. The gain factor g representing the amplitude imbalance is set to 1.02 and the phase offset $\phi$ representing the phase imbalance between the in-phase and quadrature phase signal is set to 2 degrees. The frequency difference function $H_A(f)$ is defined via the impulse response vector $h_A$=[0.01 1.0 0.02]. The spectrum 402 corresponds to an attenuated mirror spectrum of the ideal signal as described with regard to equation (2b).

Spectrum 404 illustrates an output signal of another non-ideal I/Q demodulator having a compensator unit of a first type. The span (length) N of the compensation filter is 3 and the output signal is the superposition of the filtered signal with the non-delayed input signal of the compensator unit (L=0).

Spectrum 406 is the spectrum of an I/Q demodulator having a compensator unit according to an embodiment of the invention. The length N of the compensation filter is 3 and is the same as that of the compensator unit of spectrum 404. The output signal of the compensation filter is obtained by superposition of the input signal of the compensator unit delayed by one sample interval (L=1) and a filtered signal, wherein the filter coefficients are obtained from the matrices $A_x$ and $B_x$ according to the equations (11) and (12).

Figure 4B:
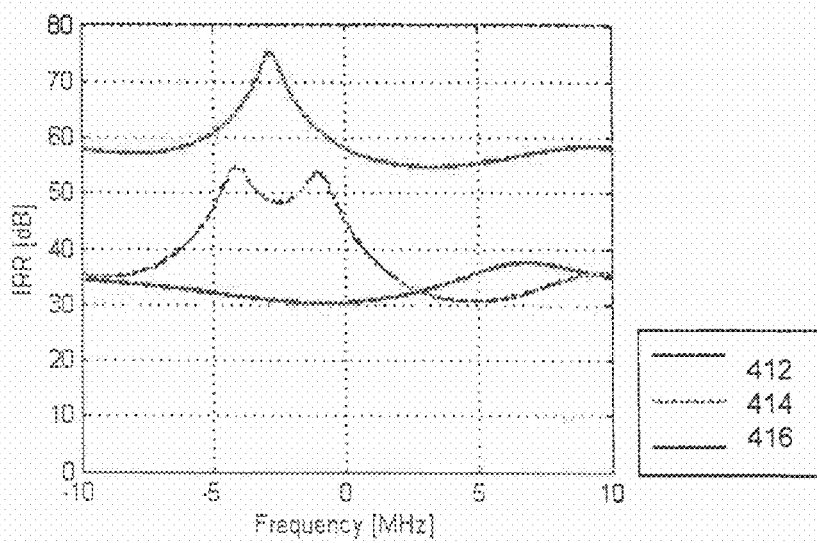
FIG. 4B is a diagram showing image rejection ratios (IRR) of the signals of FIG. 4A for illustrating the effect of the compensator unit.

FIG. 4B illustrates the image rejection ratio (IRR) representing the relationship between the spectrum of the desired output signal and the spectrum of the image signal for the spectra 402, 404, 406 of FIG. 4A. The IRR 412 of the non-compensated output signal is in the range between 30 and 40 db. The IRR 416 of the spectrum 406 of FIG. 4A is significantly higher than that of the spectrum 404 of FIG. 4A. The algorithm according to the embodiments of the invention reaches a significantly higher IRR of 55 db.

The flow chart illustrated in FIG. 5 relates to a method for processing sampled in-phase and quadrature phase signals. For each sample interval, the sampled in-phase and quadrature phase signals are superposed, wherein an intermediate signal x(t) is obtained (502). The current and the preceding autocorrelation and complementary autocorrelation function values of the intermediate signal x(t) are estimated (504). On base of the estimated autocorrelation function values, filter coefficients for an adaptive filter are determined such that a complementary autocorrelation function of an output signal y(t) is minimized for a span of the adaptive filter (506). Utilizing the adaptive filter having the estimated coefficients, a filter signal is derived from the intermediate signal x*(t) (508). The filter signal is superposed with a delayed version of the intermediate signal to obtain the output signal y(t) (510). In the output signal, the image signal is suppressed to a high degree.

In accordance with an embodiment, the filter coefficients are initialized with the value zero. According to other embodiments, the filter coefficients are initialized with a value slightly different from zero, for example a value less than or equal to 0.2, or with other values. All filter coefficients may be initialized with the same value or with different values. In accordance with an embodiment at least one filter coefficient is set to zero and the other ones are set to values near zero, for example values less than or equal to 0.2.

The delayed version of the intermediate signal may be obtained by delaying the intermediate signal by an integer multiple L of a sampling interval $T_s$ corresponding to the sample rate $f_s$ of the sampled in-phase and quadrature phase signals, wherein the integer multiple L is greater than zero. Main taps in the adaptive filter are shifted by L. Depending on L the filter coefficients are not only shifted, but the coefficient values may also change.

In accordance with an embodiment, the autocorrelation function values are estimated from the intermediate signal x(t) by using block estimation. In accordance with another embodiment, recursive estimation could be applied.

From the autocorrelation function values of the intermediate signal x(t) and the compensator output signal the respective filter coefficients are determined as those filter coefficients with which the complementary autocorrelation of the compensator output signal y(t) is minimized for the filter span. In accordance with an embodiment, the complementary autocorrelation of the compensator output signal y(t) may be zeroed or nearly zeroed.

The compensation method may be applied in the course of a method of processing a quadrature modulated receiver signal. For example, the quadrature modulated receiver signal is demodulated in a quadrature demodulator, wherein an in-phase signal and a quadrature phase signal are generated. The in-phase and quadrature phase signals are sampled, wherein sampled in-phase and quadrature phase signals are obtained. Frequency-dependent I/Q imbalance may be compensated using the above described compensation method. Even if the quadrature demodulator comprises a mixing stage and/or an analogue processing stage that leads to a non-causal filter impulse response $h_A(t)$, the compensation method suppresses image signals to a high degree. Thereby the assumed non-causal filter impulse response may approximate or model the behavior of the mixing stage and/or the analogue processing stage.

It is to be understood that the features of the various embodiments described herein may be combined with each other, unless specifically noted otherwise.

Although specific embodiments have been illustrated and described herein, it will be appreciated by those of ordinary skill in the art that a variety of alternatives and/or equivalent implementations may be substituted for the specific embodiments shown and described without departing from the scope of the described embodiments. This application is intended to cover any adaptations or variations of the specific embodiments discussed herein. Therefore, it is intended that this invention be limited only by the claims and the equivalents thereof.

The invention claimed is:

1. A compensator unit for compensating frequency-dependent imbalance between a sampled in-phase and a sampled quadrature phase signal, comprising:
   a delay channel configured to delay an intermediate signal x(t) obtained by superposition of the sampled in-phase and quadrature phase signals,
   a filter channel including a filter with variable filter coefficients determined on base of autocorrelation function values of the intermediate signal x(t) such that the complementary autocorrelation of a compensator output signal y(t) is minimized for a span of the filter, and
   a superposition unit configured to superpose output signals of the delay and the filter channels to generate the compensator output signal y(t).

2. The compensator unit of claim 1, wherein
   the delay channel comprises a delay unit configured to delay the intermediate signal x(t) by an integer multiple L in terms of a sampling interval corresponding to a sample rate of the sampled in-phase and quadrature phase signals, wherein the integer multiple L is greater than zero.

3. The compensator unit of claim 2, wherein
   the filter has a main tap which is shifted by L.

4. The compensator unit of claim 1, wherein
   a filter coefficient calculator capable of determining, from the autocorrelation function values and the complementary autocorrelation function values of the intermediate signal x(t), the respective filter coefficients as those filter coefficients with which the complementary autocorrelation of the compensator output signal y(t) is minimized for the filter span.

5. The compensator unit of claim 1, wherein
   the filter coefficients fulfill the equation $\vec{w}_2=(A_x+B_x)\vec{c}_x$, with $\vec{c}_x=[c_x(0), c_x(1), \ldots, c_x(N-1)]^T$, $\vec{w}_2=[w_2(0), w_2(1), \ldots, w_2(N-1)]^T$, $$A_x = \begin{bmatrix} \gamma_x(-L) & \gamma_x(1-L) & \ldots & \gamma_x(N-L-1) \\ \gamma_x(-1-L) & \gamma_x(-L) & \ldots & \gamma_x(N-L-2) \\ \vdots & \vdots & \ddots & \vdots \\ \gamma_x(-N-L+1) & \gamma_x(-N-L+2) & \ldots & \gamma_x(-L) \end{bmatrix}$$

$$B_x = \begin{bmatrix} \gamma_x(-L) & \gamma_x(1-L) & \ldots & \gamma_x(N-L-1) \\ \gamma_x(1-L) & \gamma_x(2-L) & \ldots & \gamma_x(N-L) \\ \vdots & \vdots & \ddots & \vdots \\ \gamma_x(N-L-1) & \gamma_x(N-L) & \ldots & \gamma_x(2N-L-2) \end{bmatrix}.$$

6. A receiver unit, comprising:
   a quadrature demodulator configured to generate, from a modulated carrier signal r(t), a sampled in-phase signal and a sampled quadrature phase signal; and
   the compensator unit as claimed in any one of claims 1 to 5.

7. The receiver unit of claim 6, wherein
   the quadrature demodulator comprises filters which are describable by a non-causal filter function in one of the channels of the quadrature demodulator.

8. A method for processing sampled in-phase and quadrature phase signals, the method comprising, for each sample interval:
   superposing the sampled in-phase and quadrature phase signals to obtain an intermediate signal x(t);
   estimating, using a microprocessor, current and preceding autocorrelation function values $\gamma_x(\tau)=E\{x(t)x^*(t-\tau)\}$ and complementary autocorrelation function values $c_x(\tau)=E\{x(t)x(t-\tau)\}$ of the intermediate signal x(t);
   estimating, using said microprocessor, on base of the estimated autocorrelation function values $\gamma_x(\tau)$ and complementary autocorrelation function values $c_x(\tau)$, filter coefficients for an adaptive filter such that a complementary autocorrelation function $E\{y(t)y(t-\tau)\}$ of an output signal y(t) is minimized for a span of the adaptive filter;
   filtering, using said microprocessor, the complex conjugated intermediate signal $x^*(t)$ utilizing the adaptive filter having the estimated coefficients to generate a filter signal; and
   superposing the filter signal with a delayed version of the intermediate signal to obtain the output signal y(t).

9. The method of claim 8, wherein
   the filter coefficients are initialized with the value zero.

10. The method of claim 8, wherein
    the delayed version of the intermediate signal is obtained by delaying the intermediate signal by an integer multiple L of a sampling interval corresponding to a sample rate of the sampled in-phase and quadrature phase signals, wherein the integer multiple L is greater than zero.

11. The method of claim 8, comprising
    estimating the complementary autocorrelation function values from the intermediate signal x(t) by using block estimation.

12. The method of claim 8, wherein
    the filter coefficients are calculated to fulfill the equation $\vec{w}_2=(A_x+B_x)\vec{c}_x$, with $\vec{w}_2=[w_2(0), w_2(1), \ldots, w_2(N-1)]^T$,
    $\vec{c}_x=[c_x(0), c_x(1), \ldots, c_x(N-1)]^T$, $$A_x = \begin{bmatrix} \gamma_x(-L) & \gamma_x(1-L) & \ldots & \gamma_x(N-L-1) \\ \gamma_x(-1-L) & \gamma_x(-L) & \ldots & \gamma_x(N-L-2) \\ \vdots & \vdots & \ddots & \vdots \\ \gamma_x(-N-L+1) & \gamma_x(-N-L+2) & \ldots & \gamma_x(-L) \end{bmatrix} \text{ and}$$

$$B_x = \begin{bmatrix} \gamma_x(-L) & \gamma_x(1-L) & \ldots & \gamma_x(N-L-1) \\ \gamma_x(1-L) & \gamma_x(2-L) & \ldots & \gamma_x(N-L) \\ \vdots & \vdots & \ddots & \vdots \\ \gamma_x(N-L-1) & \gamma_x(N-L) & \ldots & \gamma_x(2N-L-2) \end{bmatrix}.$$

13. A method of processing a quadrature modulated receiver signal, comprising
    demodulating the quadrature modulated receiver signal to generate an in-phase signal and a quadrature phase signal;
    sampling the in-phase and quadrature phase signals to obtain sampled in-phase and quadrature phase signals; and
    compensating frequency-dependent I/Q imbalance using the method of claim 8.

14. The method of claim 13, wherein
    generating the in-phase signal and the quadrature phase signal comprises mixing the quadrature modulated receiver signal in a mixing stage and filtering output signals of the mixing stage with filters, the behavior of which is describable by a non-causal filter in one of the in-phase and quadrature phase signal paths.

* * * * *